(12) United States Patent
Schaper et al.

(10) Patent No.: US 7,005,722 B2
(45) Date of Patent: Feb. 28, 2006

(54) RC TERMINATOR AND PRODUCTION METHOD THEREFOR

(75) Inventors: Leonard W. Schaper, Fayetteville, AR (US); James Patrick Parkerson, Fayetteville, AR (US)

(73) Assignee: The Board of Trustees of the University of Arkansas, Fayetteville, AR (US)

( * ) Notice: Subject to any disclaimer, the term of this patent is extended or adjusted under 35 U.S.C. 154(b) by 0 days.

(21) Appl. No.: 10/182,142

(22) PCT Filed: Jan. 26, 2001

(86) PCT No.: PCT/US01/02730

§ 371 (c)(1),
(2), (4) Date: Nov. 7, 2002

(87) PCT Pub. No.: WO01/56086

PCT Pub. Date: Aug. 2, 2001

(65) Prior Publication Data

US 2003/0057518 A1    Mar. 27, 2003

(51) Int. Cl.
*H01L 29/00* (2006.01)

(52) U.S. Cl. .................. 257/533; 257/536; 257/537; 257/307

(58) Field of Classification Search ............. 257/533, 257/300, 306, 307, 310, 532, 537, 536; 361/411, 361/306
See application file for complete search history.

(56) References Cited

U.S. PATENT DOCUMENTS

| | | | | |
|---|---|---|---|---|
| 4,410,867 A | | 10/1983 | Arcidiacono et al. | 333/172 |
| 4,458,295 A | | 7/1984 | Durschlag et al. | 361/322 |
| 4,460,938 A | * | 7/1984 | Clei | 361/779 |
| 4,866,502 A | * | 9/1989 | Tomaszewski et al. | 257/533 |
| 4,876,176 A | * | 10/1989 | Calviello et al. | 430/311 |
| 5,440,174 A | | 8/1995 | Nishitsuji | 257/770 |

FOREIGN PATENT DOCUMENTS

JP    1-223757    9/1989

* cited by examiner

*Primary Examiner*—Minhloan Tran
*Assistant Examiner*—Tan Tran
(74) *Attorney, Agent, or Firm*—Miles & Stockbridge P.C.

(57) ABSTRACT

A thin-film RC circuit element suitable for a transmission line termination circuit is prepared by a process wherein
1) a first metal layer of an anodizable metal is deposited on a substrate;
2) the exposed surface of the anodizable metal layer is anodized to produce an oxide layer,
3) a second metal layer of electrically conductive metal is provided on the oxide layer, and
4) the first metal layer is etched to form an electrically resistive conductive path electrically connected to the region f the first metal layer beneath the second metal layer. A thin-film RC circuit element is also provided having a first layer of an anodizable metal formed on an electrically insulating substrate so as to provide two capacitor plates connected by a resistive strip, an oxide layer formed on the capacitor plates, and upper capacitor plates positioned on the oxide layer in register with the lower capacitor plates.

20 Claims, 4 Drawing Sheets

RC TERMINATOR AND PRODUCTION METHOD THEREFOR

BACKGROUND OF THE INVENTION

1. Field of the Invention

This invention relates to termination circuitry for high speed digital transmission lines and more particularly to RC circuitry for terminating such transmission lines and methods for producing such circuitry.

2. Brief Description of the Prior Art

As higher and higher frequencies have come to be employed in digital electronic equipment, such as computers and the like, the effects of signal travel time between the components of the circuits have had to be considered in the design of the equipment. When the frequency of a digital electrical signal within such equipment is so high that the rise and/or fall times of the signal are shorter than the travel time of the signal from source to destination within the equipment, the signal pathways have to be treated as transmission lines. In such circuits, if the rise/fall time of the signal is shorter than about twice the propagation time from source to terminal, reflections and other signal distortions can occur. Such reflections and the like can cause switching errors, among other problems. Accordingly, good design requires that they be eliminated or at least minimized.

Reflections occurring in transmission lines are conventionally suppressed by proper termination of the transmission line. Depending upon the type of connection between the source or driver and the load connected at the terminus of the transmission line, different conventional termination types have been devised, e.g., parallel, AC, series, and Thevenin. A convenient termination circuit is parallel termination, achieved by connecting the terminal end of the line to ground through an impedance equal to the characteristic impedance of the transmission line. A simple resistor of appropriate value connected between the line terminus and ground can provide a satisfactory termination. However, such a circuit has the disadvantage that it will draw DC power. Accordingly, a termination circuit comprising a resistor in series with a capacitor is often used. In order to adequately suppress reflections, the time constant of the RC circuit should be greater than the propagation time of a signal over the transmission line. A general criterion for assuring that the time constant will be adequate is given by $$C_L R_0 > 25 t_f \quad (1)$$

where:
$C_L$ = terminating capacitance (F);
$R_0$ = terminating resistance ($\Omega$);
$t_f$ = propagation time (time of flight).

The value of the capacitor is not necessarily critical for most applications. Such applications typically include termination of microstrip transmission lines and stripline transmission lines used as circuit elements in printed wiring boards (PWBs) and multichip modules (MCMs). A value of about 50–100 pF has been reported as a good compromise for such applications. A value of 200 pF yields better signal quality, but allows greater power dissipation. Further increase in the capacitance ordinarily yields no significant improvement in signal quality and further increases the power dissipation. A lower value for the capacitor tends to make the termination ineffective.

Transmission line structures have been used for some time for routing signals between components in high-frequency circuitry formed on insulating, generally planar substrates, so-called "printed wiring boards" (PWB). Integrating functional passive devices, such as resistors and/or capacitors, into such PWB circuitry is a relatively recent development. Similarly, forming capacitor and resistor layers on either a printed wiring board or a substrate for high-density interconnection of silicon multichip modules (MCM) is also relatively new.

One commercially available structure has been developed by the AVX Corporation. In such circuitry, resistance and capacitance are distributed through a multilayer hybrid structure in which the resistive elements are made of ruthenium oxide ($RuO_2$). This oxide is used because it has both higher conductivity and greater stability than other oxide conductive materials. Consequently, resistors can be formed having values of about 50–100 $\Omega$. The dielectric in such circuits is comprised of a glass-loaded ceramic material, whereby the mechanical and thermal properties of the resistor and capacitor elements are well matched, a circumstance which leads to good reliability. These structures are prepared by conventional thick film techniques, wherein successive patterned layers of conductive, dielectric and resistive material are deposited on a typically ceramic substrate by silk screen techniques and subsequently fired. Connecting the passive devices in the layers in parallel permits reducing the resistance to a level suitable for impedance line matching, i.e., from about 10 $\Omega$ to about 220 $\Omega$. Simultaneously, the capacitance can be raised to a useful range, i.e., about 10–220 pF. This technology permits the formation of passive components in high yield to a tolerance of about 10%. However, the use of the thick film manufacturing process limits the technique to preparation of ceramic-supported structures or surface mount packages to be placed on a circuit board.

Thin-film capacitors have been prepared by depositing a metal on a substrate to serve as one plate of a capacitor, subsequently depositing a dielectric layer thereon, then depositing a second metal layer to serve as the other plate of the capacitor. The dielectric layers for such capacitors have been deposited by conventional procedures such as sputtering, sol-gel processing, metallo-organic chemical vapor deposition (MOCVD), plasma enhanced chemical vapor deposition (PECVD), pulse laser deposition, and the like. Oxide dielectrics have also been prepared by electrochemical anodization, and oxide layers so prepared have been shown to perform better than oxide layers formed by reactive sputtering. However, no integrated process appears to have been disclosed in which a thin-film resistor and capacitor have been formed as a unitary RC circuit suitable for use as a transmission line termination.

Accordingly, a need has continued to exist for a method of preparing passive RC circuits suitable for use as transmission line terminations and the like.

SUMMARY OF THE INVENTION

The problem of conveniently and economically forming a transmission line termination circuit has now been solved by the process of the invention wherein 1) a first layer of an anodizable metal (preferably a valve metal) is deposited on a substrate (preferably electrically insulating);

2) at least a portion of the exposed surface of the metal layer is anodized to produce an oxide layer, 3) a second metal layer is provided on at least a portion of the oxide layer to form the upper plate of a thin-film capacitor, and 4) the first metal layer is patterned, as by etching, to form an electrically resistive strip electrically connected to a region of the first metal layer beneath the second metal layer.

Accordingly, it is an object of the invention to provide a method for preparing an RC circuit.

A further object is to provide a process for producing an RC circuit adapted for terminating a transmission line.

A further object is to provide a thin-film method for preparing an RC circuit appropriate for terminating a transmission line.

A further object is to provide a method for preparing an RC circuit wherein the resistive element is formed from a valve metal.

A further object is to provide a method for preparing an RC circuit wherein the dielectric of the capacitive element is formed from an oxide of a valve metal.

A further object is to provide a method of forming a thin-film capacitor wherein the dielectric is formed by anodizing a thin film of a metal, preferably a valve metal.

Further objects of the invention will become apparent from the description of the invention which follows.

DETAILED DESCRIPTION OF THE INVENTION AND PREFERRED EMBODIMENTS

Figure 1A:
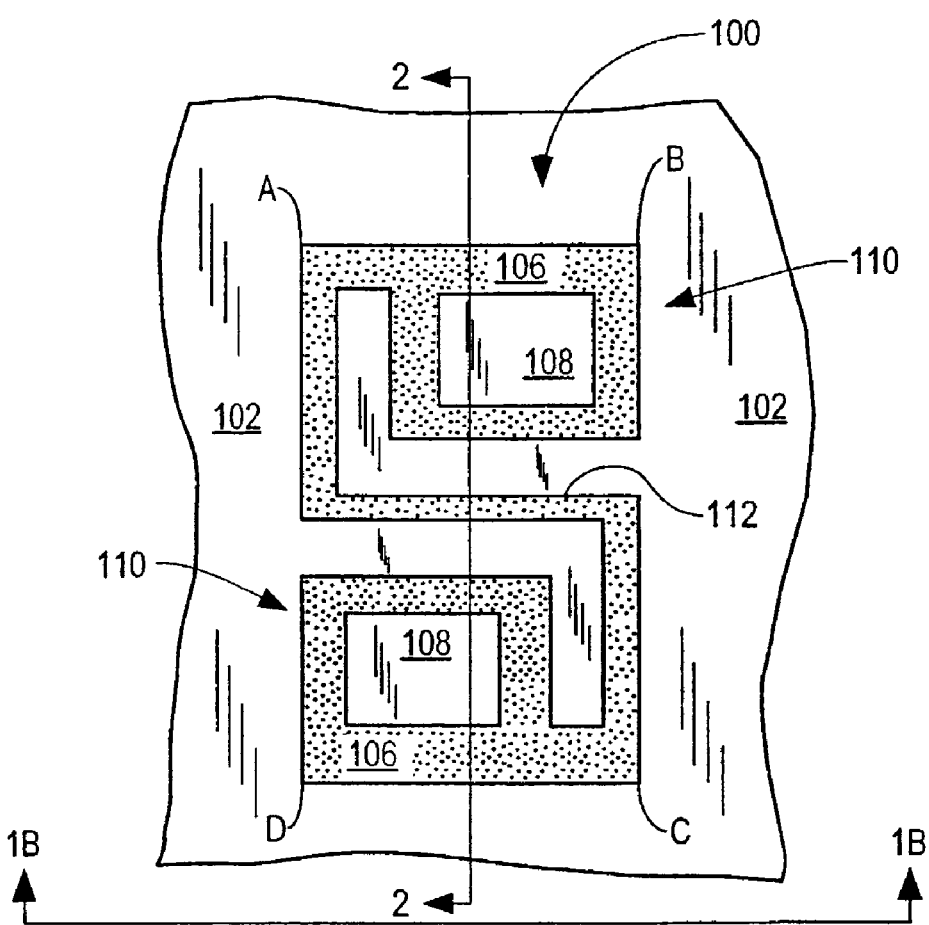
FIG. 1A shows a plan view of a thin-film RC circuit according to the invention.

According to the invention an RC circuit suitable for terminating a high frequency digital transmission line is prepared by a thin-film process wherein an anodizable metal, preferably a valve metal, deposited on an electrically insulating substrate serves both as one plate of a capacitor and as a resistive element in the RC circuit.

An RC circuit of the invention may be prepared by a process comprising the steps of:

1) depositing a first metal layer of anodizable metal, preferably a valve metal, on a substrate, preferably an electrically insulating substrate;

2) anodizing the exposed surface of the first metal layer in a pattern that provides an oxide layer over at least one region of the first metal layer to define a lower plate of a capacitor and over a strip of the first metal layer contiguous to the lower capacitor plate and electrically connected thereto to define a resistive strip element electrically connected to the lower capacitor plate;

3) forming a second metal layer on the oxide layer over the region that defines the lower capacitor plate as an upper capacitor plate, and 4) patterning the first metal layer, such as by etching, to define an electrically resistive strip electrically connected at one end thereof to the lower capacitor plate.

In a preferred embodiment, the RC termination component comprises two thin-film capacitors formed by the process of the invention having their lower plates made of an anodizable metal, the lower plates being connected by a resistor also formed from the metal, which is preferably a valve metal.

The benefits of the invention are achieved by making at least one plate of a capacitor and a resistor electrically connected thereto from an anodizable metal.

Anodization is conducted by making a metal the positive electrode in an electrochemical cell. During anodization, atoms at the surface of the metal are oxidized and may either dissolve into the solution or react with water or hydroxyl ions to form an adherent oxide. For many metals, the oxidized atoms dissolve into the electrolyte in the vicinity of the metal surface until the solution becomes saturated. The ions then precipitate as a loosely adhering film, which typically results in a low-resistance, discontinuous coating on the metal.

Certain metals, generally identified as "valve metals", when subjected to anodization react directly with the water molecules or hydroxyl ions in the presence of the electric field and do not dissolve into the electrolyte solution. The result is a continuous, amorphous, highly resistive film that can function as a dielectric for many uses, including integrated capacitors. Accordingly, in the practice of the present invention, valve metals are especially preferred to use as the anodizable metal. Table 1 lists some suitable valve metals and the dielectric constants of their oxides.

TABLE 1

Anodizable Valve Metals

| Metal | Oxide | Dielectric Constant of Oxide |
|---|---|---|
| Aluminum (Al) | $Al_2O_3$ | 10 |
| Zirconium (Zr) | $ZrO_2$ | 12 |
| Bismuth (Bi) | $Bi_2O_3$ | 18 |
| Antimony (Sb) | $Sb_2O_3$ or $Sb_2O_4$ | ~20 |
| Tantalum (Ta) | $Ta_2O_5$ | 22 |
| Titanium (Ti) | $TiO_2$ | 40 |
| Niobium (Nb) | $Nb_2O_5$ | 41 |
| Tungsten (W) | $WO_3$ | 42 |
| Hafnium (Hf) | $HfO_2$ | 45 |

Among the anodizable valve metals listed in Table 1, tantalum (Ta) is most preferred for use in the method of the invention. Tantalum yields an oxide of relatively high dielectric constant (about 22), which makes it attractive for a capacitor dielectric. Tantalum is also anodizable in many common electrolytes over the entire range of practical pH's with very high current efficiency approaching and/or reaching 100 %. Other usable anodizable valve metals may be less preferred. For example, aluminum (Al) has an oxide with a lower dielectric constant (about 10), and must be anodized in a narrow range of electrolyte pH (about 6–9) to obtain an oxide layer having properties suitable for a capacitor dielectric. Consequently, the practice of the invention will be described in the following in terms of the use of tantalum as the anodizable metal. However, the skilled practitioner can readily select suitable metals to produce operable RC circuit elements according to the invention.

The design of the RC circuit element of the invention will now be described with reference to the drawings.

Figure 1B:
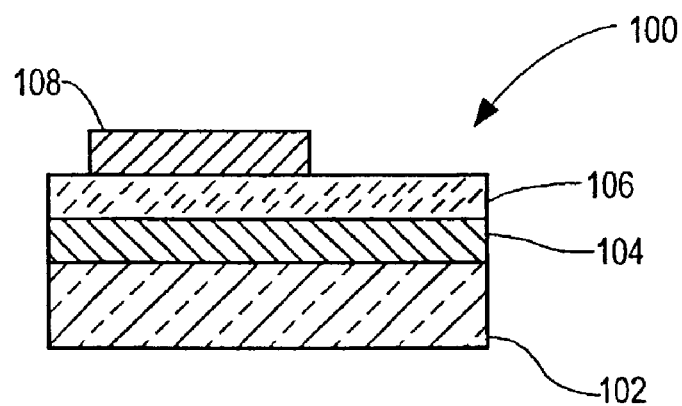
FIG. 1B shows a side elevation view of the thin-film RC circuit of FIG. 1A in the direction indicated by the line 1B—1B.

FIGS. 1A and 1B show a preferred embodiment of an RC circuit 100 of the invention. FIG. 1A shows a plan view of the RC circuit, and FIG. 1B shows a side elevation view in the direction indicated by the line 1B—1B in FIG. 1A.

As best seen in FIG. 1A, the RC transmission line termination circuit comprises two parallel-plate thin-film capacitors 110 with their plates on one side being electrically connected together by way of a resistive strip 112.

As best seen in FIG. 1B, an electrically insulating substrate 102 bears a first layer 104 of an anodizable electrically conductive metal, e.g., tantalum. The thickness of the metal layer 104 is determined based on the resistivity of the metal and the dimensions of the resistive strip 112 that connects the two capacitor portions 110 of the RC termination. The thickness of the layer 104 is chosen so that a resistive strip 112 having an appropriate resistance can be formed within the confines of the small dimensions that are desirable for the RC termination. Typically, the thickness may vary from about 0.5 $\mu$m to about 5 $\mu$m, preferably from about 0.8 $\mu$m to about 3 $\mu$m. When tantalum is used as the metal layer 104, the thickness is preferably from about 1 $\mu$m to about 2 $\mu$m.

A layer of tantalum oxide $Ta_2O_5$ 106 is formed on the surface of tantalum layer 104 to serve as the dielectric of the capacitors 110. The thickness of the tantalum oxide layer is determined by the design capacitance value of the capacitor portions 110 of the RC termination component. The capacitance is determined by the area of the plates, the dielectric constant of the dielectric and the thickness of the dielectric. The skilled practitioner will balance these design parameters to produce a target capacitance value. For a tantalum oxide dielectric using capacitor plates of a size useful in termination of transmission lines, the oxide layer thickness may vary from about 500 Angstroms to about 3000 Angstroms, preferably being about 1000–2000 Angstroms. The tantalum oxide layer 106 is also present over the resistive strip 112, where it serves as a resist when the metal layer 104 is etched to form the lower plates of the capacitors and the resistive strip 112. The tantalum oxide layer 106 over the resistive strip also performs a protective function in the finished RC termination circuit.

In order to form the tantalum oxide layer 106 in the pattern covering the lower plates of the capacitors 110 and the resistive strip 112, the anodization may be performed through an appropriate resist mask, as discussed in more detail below.

To form the upper plates of the capacitors 110, a second metal layer 108 of an electrically conductive metal, e.g., copper, or the like, is placed or formed on layer 106 over each of the lower capacitor plates. The upper plates of the capacitors 110 serve additionally as contact pads for connecting the RC circuit to other components of an apparatus. The thickness of the upper metal layer is not critical, and is chosen to provide convenient processing, i.e., deposition and etching. Typically, the upper layer is made of copper and has a thickness of about 2 $\mu$m. Although the upper conductive layer 108 can be formed by any convenient method, it is preferred to deposit a complete layer over the metal layer 104 and anodized oxide layer 106, and then to etch away all of the layer except the portions 108 forming the upper plates of the capacitors 110. Alternately, the plates 108 could be printed with some form of sinterable copper or other metallic paste preferably deposited over a continuous sputtered conductor such as titanium. A subsequent acid etch would remove the unwanted titanium everywhere except under plates 108, where it serves as a continuous conductive layer to define the interface between plates 108 and dielectric 106.

The equivalent circuit of the resistor-capacitor combination illustrated in FIG. 1A comprises two capacitors connected in series by a resistor. Electrical connections are made to the upper plates 108 to test the circuit or to integrate it into an electrical apparatus, e.g., to connect the RC circuit to a transmission line and to ground to serve as a transmission line termination. Although the RC structure as designed does not readily allow direct measurements of the resistance and capacitance values, measurements of the impedance versus frequency permits determining the specific resistance and capacitance values.

The layer of tantalum oxide 106 covers the entire tantalum layer 104, including the portion that serves as the resistor 112. This arrangement is a preferred embodiment that has certain advantages. Forming a complete and continuous layer of tantalum oxide permits the use of only two photomasks in the fabrication process, as will be explained in more detail below, because the tantalum oxide protects the underlying tantalum during the tantalum wet etch step. Anodization of tantalum has also been used to trim the resistance of tantalum resistors. However, even if this function is limited in this case because the tantalum layer is relatively thick (>1 micrometer) and the tantalum oxide does not extend very deep into the tantalum layer (<0.1 micrometer), the anodized tantalum oxide layer 106 can serve as a protective layer to protect the resistor from oxidation due to exposure to air over long periods of time.

An advantage of the RC circuit design of the invention is its capability to be easily scaled for components of differing physical size. For example, it can be made in the standard surface mount capacitor size, namely 0402, which has a footprint of 1000 $\mu$m by 500 $\mu$m. However, the size can be readily reduced to accommodate a capacitor plate dimension of only 250 $\mu$m on a side or less. The size of the capacitor plates can also be made larger as needed. Furthermore, the system designer can target different component values without fundamentally changing the design of the structure. This adjustment may be accomplished by controlling the sputtered thickness of the tantalum film and the anodized thickness of the tantalum oxide. Accordingly, the process is very flexible and can be readily adapted to the requirements of a particular product and/or a particular end user. The process can be applied to produce many different RC termination circuits simply by adjusting two process parameters, i.e. the sputter time for the Ta film and the anodization voltage for the tantalum oxide.

Figure 3A:
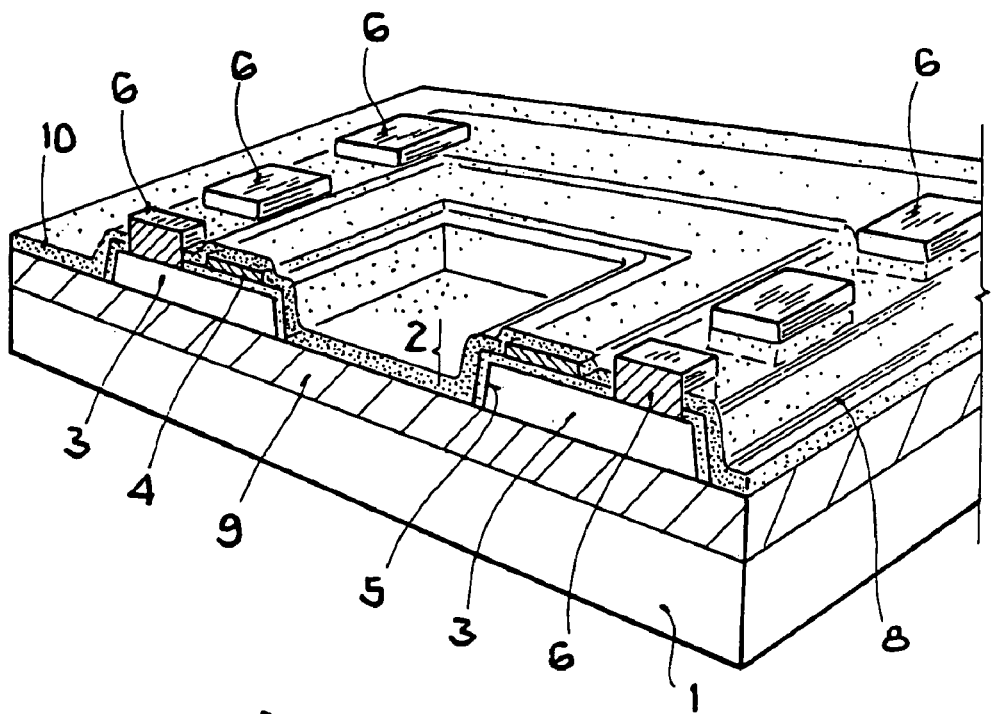
FIG. 3 shows a plan view of an array of RC terminations according to the invention, each RC termination having a generally U-shaped configuration, with the capacitor plate regions at the ends of the U-shapes being interdigitated.
Figure 3B:
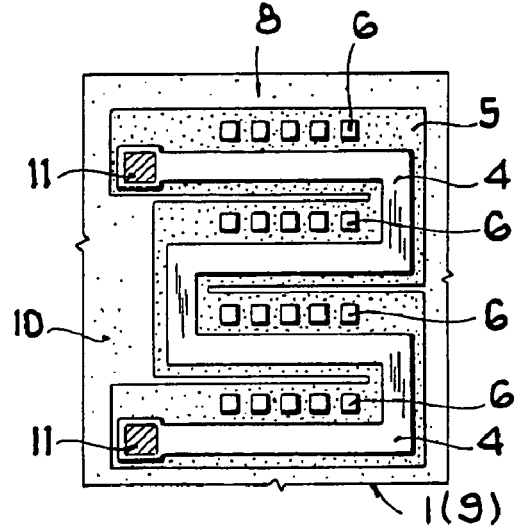

The thin-film RC termination circuit of the invention can have any external shape, provided only that it includes at least one capacitor and one resistor connected thereto. However, a design of the type generally illustrated in FIG. 1A is a preferred configuration. Such a circuit has a general S-shape with first and second capacitor plate regions located at the ends of the S-shape and a resistive strip region forming a generally S-shaped curve extending between the first and second capacitor plate regions. This design provides a particularly compact circuit, well adapted for use in miniaturized equipment such as multichip modules. As will be appreciated from FIG. 1A, The preferred circuit configuration is quite compact, having edges which define a substantially rectangular area ABCD, and represents a highly efficient use of available space on the substrate. For example, note that the design allows for a substantial length of the resistor strip within the area of the rectangle ABCD. Of course, although the design is shown as a S-shaped structure, a mirror image of Z-shaped structure would evidently be equivalent. A U-shaped structure, such as seen in FIG. 3, offers certain advantages, such as the ability to interdigitate the capacitor regions of multiple RC components, which may allow for more convenient connection to associated circuitry in some designs. FIG. 3 shows a plan view of an array of U-shaped embodiments of the RC circuits of the invention with interdigitated capacitor plate regions and solder bumps 114 positioned on the upper capacitor plates 108.

It should be noted that high speed digital circuitry often involves the use of multiple transmission lines, or buses. The compact nature of the present invention facilitates the creation of multiple RC terminations on one physical device, which might typically be assembled to the matching circuitry on a printed wiring board with small solder spheres 114 connected to regions of the plates 108. Thus one device fabricated according to the principles of the current invention can replace many discrete resistors and capacitors, with great savings in printed wiring board area. It is possible in such a multiple RC device that the common, grounded side of the terminations could share one or more common ground connections.

The fabrication process for the thin-film RC circuitry of the invention permits these components to be produced with a minimum of material layers and photomasks. Use of a relatively high-resistivity metal that is also anodizable, such as tantalum, allows three basic material levels to form the whole structure. The levels may be defined as the bottom plates and resistor level, the capacitor dielectric level, and the capacitor top plates level.

The fabrication process requires only two photomasks. The first photomask is applied for the anodization step. This mask is applied to the deposited Ta layer and exposes the entire area of the surface that is used for the RC circuit for anodization, while protecting those portions of the metal layer that will be later discarded. The second mask is an etch mask that covers the top plates, e.g., copper plates, as shown in FIG. 2D. This etch mask, along with the exposed tantalum oxide, serves as the etch mask for the Ta bottom metal. Alternately, if a printed copper paste or other printable material is used to form the upper capacitor plates, only one photomask is required.

Wet etchants used are generally conventional. A preferred etch for copper is 23% $HNO_3$, 23% acetic acid, and 9% $H_2SO_4$. This is a very rapid etch, etching 2 $\mu m$ of Cu in approximately 2 minutes or less. Titanium (Ti) is conveniently etched in a solution composed of 2% HF/0.5% $HNO_3$. This relatively dilute solution of HF etches 500 Angstroms of Ti in less than 1 minute. Tantalum is preferably etched with 20% HF/20% $HNO_3$. This relatively concentrated HF solution etches 0.5 $\mu m$ of Ta in about 1.5 minutes.

Consequently, the fabrication process for the RC termination of the invention may be described as follows with reference to FIGS. 2A–2E, which show an elevational cross section of the RC circuit along the line 2—2 in FIG. 1A. (Those skilled in the art will recognize that the orientation of the substrate and layers formed thereon is not relevant to the performance of the steps of the process. Nevertheless, the conventional terminology will be used in which the surfaces shown in the drawings as upwardly oriented may be defined as "upper" surfaces.)

A substrate 102 is selected and cleaned by conventional procedures. Any substrate that will support the thin film layers of the RC circuit without interfering with the operation of the resistor strip is suitable. That is it should not provide relatively low-resistance electrical connection between the capacitors that would vitiate the effect of the resistor strip. The limits of substrate conductivity that permit satisfactory operation of the RC termination circuitry can be readily determined by experiment, or even by consulting tabulated material properties and calculating the effect of a material's conductivity on the properties of an RC termination formed thereon. In general, it is preferred that the substrate be a very good electrical insulator, e.g., a smooth ceramic or glass substrate. However, other materials may also be used. For example, a silicon wafer having an insulating layer of oxide formed on its surface may be used. However, even such silicon wafers were observed to have an effect on the electrical properties of the RC terminations fabricated thereon by the process of the invention. A preferred substrate is glass that has been coated with a 5 $\mu m$ layer of benzocyclobutene (BCB), as is conventional, to make it resistant to the wet etch solutions containing HF that are used in the fabrication process.

A layer of tantalum 104 is then deposited on the substrate by a conventional sputtering procedure. Typical sputtering conditions are 2.0 kW power level for 200 seconds, which yields a Ta layer 104 having a thickness of about 1 $\mu m$. The Ta-coated substrate is shown in cross-section in FIG. 2A.

A suitable photoresist, e.g., a conventional positive photoresist, is then applied to the Ta layer 104, and patterned. The resist may be applied and patterned by any conventional procedure. A suitable procedure is to apply the resist as a solution in a volatile solvent by spinning, dry the resist, then expose through a photomask to leave a soluble portion of the resist layer in the location where RC terminations are to be formed. The exposed resist is then developed to expose the areas selected for further processing and subjected to a hardbake step.

The Ta layer 104, covered with the patterned resist, is then anodized to an appropriate voltage for a preselected thickness. The anodization procedure is generally conventional. Typically, the anodization is conducted by immersing the anodizable metal layer 104 with its patterned resist layer in an electrolyte together with a counterelectrode and passing an electric current between the counterelectrode and the layer to be anodized. The anodizable layer is made the anode in the electrolytic cell. The anodization is typically performed in two steps. In a first step the current is held constant, and in a second step the voltage is held constant. It has been observed that oxides grown with such a two-step mechanism have superior properties as capacitor dielectrics (e.g., lower leakage and higher breakdown voltage). The two-step process also permits better control of the thickness of the oxide layer because the current decreases to a low value toward the end of the process. This permits the operator to make final adjustments more accurately. Typically, the first step in the anodization process is performed at a constant current density. Any conventional current density is applicable. However, a preferred current density is in the range from about 0.25 $mA/cm^2$ to over 1 $mA/cm^2$. Capacitor dielectrics prepared by anodization within this preferred range have shown very low defect density (~0.07 defects/$cm^2$). During this constant current step, the voltage across the cell increases steadily as the oxide layer builds up and increases the resistance of the electrolytic circuit. Once a preselected voltage level is reached, that voltage is held constant as the anodization proceeds until the current has decreased to a value less than 10% of the initial value. Typically, the final voltage is determined by the thickness of the anodized oxide layer and its inherent properties. For example, for Ta, the anodization voltage ratio is 16 Angstroms per volt. Consequently, the thickness of the anodized oxide layer can be determined by continuing the anodization until the voltage across the electrolytic cell has reached a predetermined level. A final voltage of about 120 volts will typically yield a tantalum oxide layer 106 having a thickness of about 2100 Angstroms.

Figure 2A:
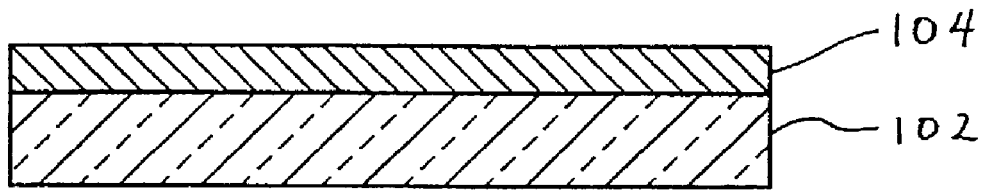
FIGS. 2A–2E are cross-sectional views showing the formation of the thin-film capacitors and resistor of FIGS. 1A and 1B.
Figure 2B:
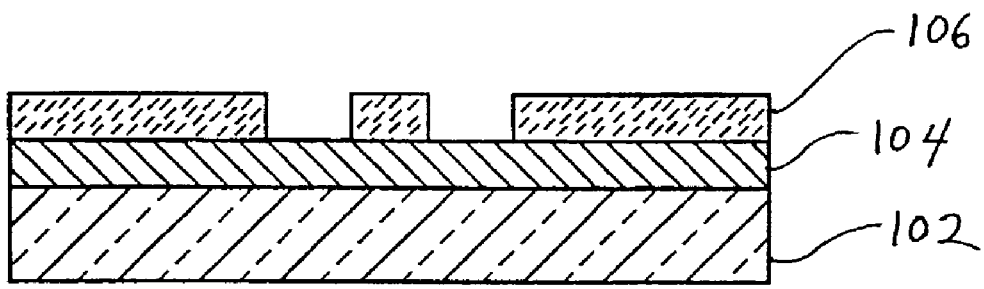

Following the anodization step, the photoresist is stripped by conventional procedures to yield an intermediate structure having a substrate 102, tantalum layer 104 and tantalum oxide layer 106, as shown in FIG. 2B.

Figure 2C:
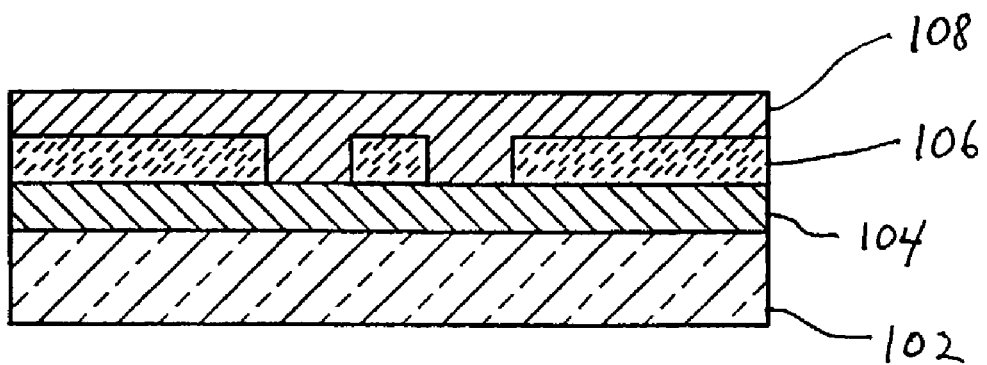
Figure 2D:
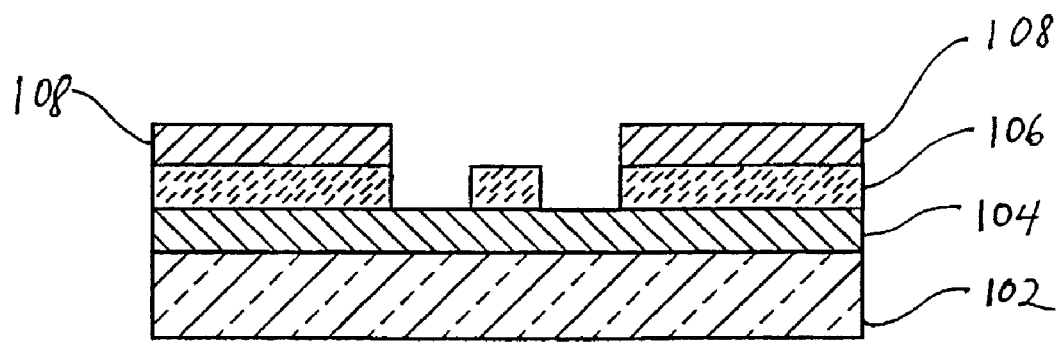
Figure 2E:
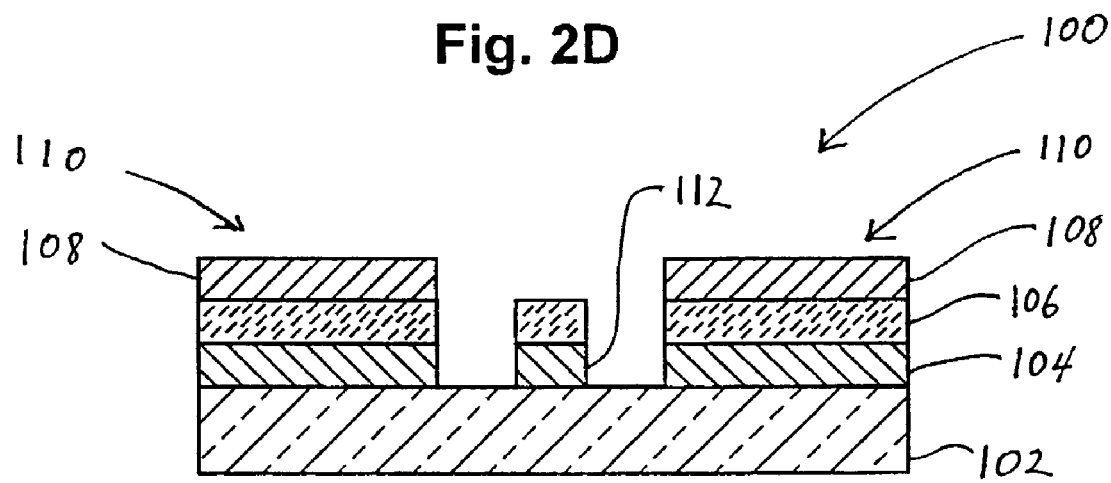

An upper electrical conductive layer is then formed over the patterned tantalum oxide layer. A typical procedure is to apply a very thin layer of titanium (about 250 Angstroms to about 750 Angstroms, preferably about 500 Angstroms) by sputtering at 2.5 kW for about 11 seconds, followed by a layer of copper 108 having a thickness of about 1 $\mu$m to about 3 $\mu$m, preferably about 2 $\mu$m (e.g., 3.0 kW for about 96 seconds). The thin titanium layer is preferably included because it improves the adhesion of the copper layer to the tantalum oxide layer. The skilled practitioner will recognize that that such an adhesion-enhancing layer is optional, depending on the details of the metals chosen for constructing the RC termination and the process parameters, such as the choice of particular etchants and the like. The resulting structure is illustrated in FIG. 2C, where the very thin layer of titanium is not shown.

The conductive, e.g., copper, layer is then patterned by applying, imaging, developing and baking a photoresist layer as above. The patterned resist layer exposes those portions of the copper layer that are to be removed to leave only the upper plate/connecting pad regions of the capacitors. The etching is conducted by conventional procedures using generally conventional etchants as indicated above. A similar etch removes the thin Ti layer in the same regions as the copper was removed. The resulting structure is illustrated in FIG. 2D, which shows the Ta layer 104 remaining intact and masked, where the resistor strip is to be formed, by the layer of tantalum oxide 106. Alternately, the conductive copper regions could be formed by printing areas of sinterable copper paste at appropriate locations over the thin Ti layer, and then sintering the paste at the appropriate temperature. The Ti layer would be etched, with the copper plate masking the remaining Ti.

Finally, the tantalum layer 104 is etched by the procedure described above to form the resistor element of the RC termination circuit. The final structure is shown in cross-section in FIG. 2E.

The preferred procedure outlined above may be summarized in the following steps:
1. Sputter Ta (1–2 $\mu$m)
2. Pattern Ta layer with photomask (Apply resist, image through photomask, develop, bake.)
3. Anodize Ta layer to appropriate voltage
4. Strip photoresist
5. Sputter Ti (500 Angstroms)
6. Sputter Cu (2 $\mu$m)
7. Pattern Cu layer with photomask (Apply resist, image through photomask, develop, bake.)
8. Etch Cu layer to form upper capacitor plates
9. Etch Ti layer to expose Ta layer
10. Etch Ta layer to form resistor strip The practice of the invention will be illustrated by the following example, which is not intended to be interpreted as limiting the scope of the appended claims.

EXAMPLE

This example illustrates the preparation of RC transmission line termination circuits according to the invention.

RC transmission line termination circuits were fabricated on glass substrates by the procedure generally described above. The glass substrates were made from alkaline earth aluminosilicate glass (Precision Glass & Optics, Santa Ana, Calif.) in the form of circular wafers 1.1 mm thick and 125 mm in diameter having a 32.5 mm orienting flat to correspond with the shape of standard silicon wafers that are usually fabricated in the equipment. The wafers were coated with a 5 micrometer layer of BCB on each side prior to processing in order to increase their resistance to the HF etching solutions used in preparing the RC circuits.

Photomasks were prepared for patterning the layers of material to form the RC circuits. The masks were prepared by conventional artwork and processing procedures and contained images for fabricating about 7500 RC circuits on one wafer. Three sizes of RC termination circuits were designed and included in the photomasks. The dimensions of the RC circuits are given in Table 2.

TABLE 2

RC Terminator Component Sizes

|  | Small | Medium | Large |
| --- | --- | --- | --- |
| Resistor width ($\mu$m) | 27 | 27 | 27 |
| No. of squares | 44.9 | 58.6 | 60.5 |
| Length off Capacitor Side ($\mu$m) | 285 | 380 | 430 |
| Capacitor area (cm$^2$) | 8.1E-4 | 1.4E-3 | 1.8E-3 |
| Component Width ($\mu$m) | 435 | 525 | 575 |
| Component Length ($\mu$m) | 845 | 1025 | 1125 |

The photomasks included about 3000 small components, 3000 medium components, and 1500 large components in a mask for a 5 inch diameter substrate wafer.

Two wafers were processed under conditions selected to yield Ta layers of ~1 $\mu$m and ~2 $\mu$m, respectively. The fabrication specifications for RC terminator wafers A and B are given in Table 3.

TABLE 3

Fabrication Specifications for RC Terminator Wafers A and B

|  | Wafer A | Wafer B |
| --- | --- | --- |
| Ta Sputter Time (s) | 200 | 400 |
| Ta Thickness ($\mu$m) | ~1 | ~2 |
| Anodization Voltage | 120 | 120 |
| Ta$_2$O$_5$ Thickness (Angstroms) | 2088 | 2088 |
| Ti Sputter Thickness (Angstroms) | 500 | 500 |
| Cu Sputter Thickness ($\mu$m) | 2 | 2 |

The processing procedure for fabricating the RC components was as follows:
1. Sputter Ta (1–2 $\mu$m)
2. Sputter Ti (500 Angstroms)
3. Pattern Ta layer with photomask (Apply resist, image through photomask, develop, bake.)
4. Etch Ti layer to expose Ta layer
5. Anodize Ta layer to appropriate voltage
6. Strip photoresist
7. Sputter Ti (500 Angstroms)
8. Sputter Cu (2 $\mu$m)

9. Pattern Cu layer with photomask (Apply resist, image through photomask, develop, bake.)
10. Etch Cu layer to form upper capacitor plates
11. Etch Ti layer to expose Ta layer
12. Etch Ta layer to form resistor strip It was found that providing a Ti layer before the first patterning step (Step 3 above) produced better edge definition of the resistor strip than if such a layer were omitted, presumably because it enhances the adhesion of the photoresist to the tantalum layer. Consequently, the above procedure is a more-preferred procedure.

The impedance of 300 representative RC components prepared by the above process was measured with a Hewlett-Packard HP4291A Impedance Analyzer over a frequency range of 1 MHz to 1 GHz in order to evaluate the resistance and capacitance values of the components. The results of the measurements for Wafer A are presented in Table 4.

TABLE 4

Resistance and Capacitance Values for Wafer A

|  | Small | Medium | Large |
|---|---|---|---|
| $R_{avg}$ ($\Omega$) | 97 | 119 | 132 |
| $R_{predicted}$ ($\Omega$) | 94 | 123 | 126 |
| 3 $\sigma$ (% of average) | 17.5 | 11.0 | 13.5 |
| $C_{avg}$ (pF) | 38 | 70 | 92 |
| $C_{predicted}$ (pF) | 39 | 70 | 89 |
| 3 $\sigma$ (% of average) | 4.1 | 3.6 | 3.6 |
| No. of defects (bad capacitors) | 0 | 1 | 0 |

The 3 $\sigma$ values indicate that 99% of the data points lie within the given percentage range of the average value. The desired 3 $\sigma$ range is 10% of the average thickness. Consequently, it may be seen that the values for the resistor vary somewhat more than would be desired. Presumably this represents a variation in the thickness of the sputtered Ta film. The 3 $\sigma$ values for the capacitance values indicate that the thickness of the anodized tantalum oxide layer is very uniform. Furthermore, only one bad capacitor out of the 600 measured (300 components, each having two capacitors) was found, indicating a very high yield. The calculated defect density for both Wafers A and B was 0.002 defects/cm$^2$. In any case the results of the example illustrate that good agreement between predicted (i.e., design) values for RC termination components according to the invention can be achieved. The results of measurements on the RC termination components prepared on Wafer B were somewhat less satisfactory, presumably because of variable thickness in the sputtered Ta layer and poor control of the etching steps. Nevertheless, some usable RC termination units conforming generally to the requirements for such units were obtained.

In order to verify that the RC terminations prepared in the example were suitable for terminating a transmission line, the measured values for selected RC termination units were used in a simulation of a terminated loaded transmission line performed on a digital computer using the standard PSPICE circuit simulation program. The most relevant units chosen for use in the simulation were the small component size on Wafer A, having R=9 $\Omega$ and C=38 pF and the large component size RC termination from Wafer B, having R=55 $\Omega$ and C=70.5 pF. The simulation results demonstrated that the selected RC termination components are effective as RC terminations for transmission lines.

The invention having now been fully described, it should be understood that it may be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

We claim:

1. A thin-film RC circuit element, comprising:
   a layer of an anodizable metal, including at least one resistive strip region having a first end and a second end, and at least a first capacitor plate region electrically connected to said first end of said resistive strip region,
   a layer of an oxide of said anodizable metal formed directly on at least said first capacitor plate region,
   a conductive electrode covering at least a portion of said oxide layer formed directly on said first capacitor plate region,
   a second capacitor plate region of said anodizable metal layer electrically connected to said second end of said resistive strip region,
   a layer of oxide of said anodizable metal formed directly on at least said second capacitor plate region, and
   a conductive electrode covering at least a portion of said oxide layer formed directly on said second capacitor plate region.

2. The thin-film RC circuit element of claim 1, wherein a layer of said oxide of said anodizable metal is formed directly on said resistive strip region of said anodizable metal layer.

3. The thin-film RC circuit element of claim 1, wherein said circuit element is generally S-shaped with said first and second capacitor plate regions located at the ends of the S-shape, and said resistive strip region forms an intermediate portion of the S-shape.

4. The thin-film RC circuit element of claim 1, wherein said circuit element is generally U-shaped with said first and second capacitor plate regions located at the ends of the U-shape.

5. An array of thin-film RC circuit elements of claim 4, comprising a plurality of said U-shaped thin-film RC circuit elements wherein said capacitor plate regions at said ends of said U-shapes are interdigitated.

6. A two-terminal thin-film RC circuit element, comprising:
   a layer of an anodizable metal, including at least one resistive strip region having a first end and a second end, and at least a first capacitor plate region electrically connected to said first end of said resistive strip region,
   said first capacitor plate region of said metal layer having an anodically oxidized surface,
   a conductive electrode covering at least a portion of said anodically oxidized surface of said first capacitor plate region,
   a second capacitor plate region of said anodizable metal layer electrically connected to said second end of said resistive strip region,
   said second capacitor plate region of said metal layer having an anodically oxidized surface, and a conductive electrode covering at least a portion of said anodically oxidized surface of said second capacitor plate region.

7. The two-terminal thin-film RC circuit element of claim 6, wherein said resistive strip region of said anodizable metal layer has an anodically oxidized surface.

8. The two-terminal thin-film RC circuit element of claim 6, wherein said circuit element is generally S-shaped with said first and second capacitor plate regions located at the ends of the S-shape, and said resistive strip region forms an intermediate portion of the S-shape.

9. The two-terminal thin-film RC circuit element of claim 6, wherein said circuit element is generally U-shaped with said first and second capacitor plate regions located at the ends of the U-shape.

10. An array of two-terminal thin-film RC circuit elements of claim 9, comprising a plurality of said U-shaped thin-film RC circuit elements wherein said capacitor plate regions at said ends of said U-shapes are interdigitated.

11. A thin-film RC circuit element, comprising:
a layer of an anodizable metal, including at least one resistive strip region having a first end and a second end, and at least a first capacitor plate region electrically connected to said first end of said resistive strip region,
a layer of an oxide of said anodizable metal formed directly on at least said first capacitor plate region,
a conductive electrode covering at least a potion of said first capacitor plate region but not said resistive strip region,
a second capacitor plate region of said anodizable metal layer electrically connected to said second end of said resistive strip region,
a layer of oxide of said anodizable metal being formed directly on at least said second capacitor plate region, and
a conductive electrode covering at least a portion of said oxide layer formed on said second capacitor plate region but not said resistive strip region.

12. The thin-film RC circuit element of claim 11, wherein a layer of said oxide of said anodizable metal is formed on said resistive strip region of said anodizable metal layer.

13. The thin-film RC circuit element of claim 11, wherein said circuit element is generally S-shaped with said first and second capacitor plate regions located at the ends of the S-shape, and said resistive strip region forms an intermediate portion of the S-shape.

14. The thin-film RC circuit element of claim 11, wherein said circuit element is generally U-shaped with said first and second capacitor plate regions located at the ends of the U-shape.

15. An array of thin-film RC circuit elements of claim 14, comprising a plurality of said U-shaped thin-film RC circuit elements wherein said capacitor plate regions at said ends of said U-shapes are interdigitated.

16. A thin-film RC circuit element, comprising:
a substrate,
a layer of an anodizable metal on a surface of said substrate, said layer of anodizable metal having at least one resistive strip region having a first end and a second end, and at least a first capacitor plate region electrically connected to said first end of said resistive strip region,
said first capacitor plate region of said metal layer having an anodically oxidized surface,
a conductive electrode covering at least a portion of said anodically oxidized surface of said first capacitor plate region,
a second capacitor plate region of said anodizable metal layer electrically connected to said second end of said resistive strip region,
said second capacitor plate region of said metal layer having an anodically oxidized surface, and
a conductive electrode covering at least a portion of said anodically oxidized surface of said second capacitor plate region.

17. The thin-film RC circuit element of claim 16, wherein said resistive strip region of said anodizable metal layer has an anodically oxidized surface.

18. The thin-film RC circuit element of claim 16, wherein said circuit element is generally S-shaped with said first and second capacitor plate regions located at the ends of the S-shape, and said resistive strip region forms an intermediate portion of the S-shape.

19. The thin-film RC circuit element of claim 16, wherein said circuit element is generally U-shaped with said first and second capacitor plate regions located at the ends of the U-shape.

20. An array of thin-film RC circuit element of claim 19, comprising a plurality of said U-shaped thin-film RC circuit elements wherein said capacitor plate regions at said ends of said U-shapes are interdigitated.

* * * * *